(12) United States Patent
Wu et al.

(10) Patent No.: US 12,358,646 B2
(45) Date of Patent: Jul. 15, 2025

(54) METHOD AND APPARATUS FOR CAPTURING NON-COOPERATIVE TARGET USING SPACE ROBOTIC ARM, AND NON-TRANSITORY STORAGE MEDIUM

(71) Applicant: Harbin Institute of Technology, Harbin (CN)

(72) Inventors: Fan Wu, Harbin (CN); Xibin Cao, Harbin (CN); Zhengda Cheng, Harbin (CN); Ruichen Xi, Harbin (CN); Yunhai Geng, Harbin (CN)

(73) Assignee: Harbin Institute of Technology, Harbin (CN)

( * ) Notice: Subject to any disclaimer, the term of this patent is extended or adjusted under 35 U.S.C. 154(b) by 197 days.

(21) Appl. No.: 18/469,831

(22) Filed: Sep. 19, 2023

(65) Prior Publication Data
US 2024/0109675 A1    Apr. 4, 2024

(30) Foreign Application Priority Data
Sep. 21, 2022   (CN) .......................... 202211151231.3

(51) Int. Cl.
*B64G 1/10*   (2006.01)
*B25J 15/06*  (2006.01)
(Continued)

(52) U.S. Cl.
CPC ........ *B64G 1/1081* (2023.08); *B25J 15/0608* (2013.01); *G06F 30/17* (2020.01); *B64G 2004/005* (2013.01)

(58) Field of Classification Search
None
See application file for complete search history.

(56) References Cited

U.S. PATENT DOCUMENTS

| 5,145,227 A * | 9/1992 | Monford, Jr. ............ B64G 4/00 |
| | | 414/737 |
| 2003/0216836 A1* | 11/2003 | Treat ...................... A61B 90/92 |
| | | 700/245 |

(Continued)

FOREIGN PATENT DOCUMENTS

| CN | 109250157 A | 1/2019 |
| CN | 109807886 A | 5/2019 |

(Continued)

OTHER PUBLICATIONS

Cao et al., A Method of Managing Dual-Spin Spacecraft's Angular Momentum With Magnetic Torquers, Journal of Astronautics, 2019, 40(3), pp. 327-333, dated Mar. 30, 2019.

(Continued)

*Primary Examiner* — Thomas E Worden
*Assistant Examiner* — Alexandra R. Morford
(74) *Attorney, Agent, or Firm* — Westbridge IP LLC

(57) ABSTRACT

Disclosed are a method, a device, an apparatus for capturing a non-cooperative target using a space robotic arm, and a non-transitory storage medium, and relates to the technical field of on-orbit servicing. The method is applied to a space robotic arm with a magnetic capture device as an end actuator. The method includes: establishing a magnetic (Continued)

establishing a magnetic attractive force model for the magnetic capture device and determining a magnetic attractive force characteristic of the magnetic capture device according to the magnetic attractive force model — S201 determining a capture strategy for the non-cooperative target based on the magnetic attractive force characteristic of the magnetic capture device — S202 capturing the non-cooperative target according to the capture strategy and determining whether the non-cooperative target is captured based on a preset determination condition — S203 attractive force model for the magnetic capture device, determining a magnetic attractive force characteristic of the magnetic capture device based on the magnetic attractive force model, determining a capture strategy for the non-cooperative target based on the magnetic attractive force characteristic of the magnetic capture device, capturing the non-cooperative target according to the capture strategy, and determining whether the non-cooperative target is captured based on a preset determination condition.

17 Claims, 12 Drawing Sheets

(51) Int. Cl.
  B64G 4/00 (2006.01)
  G06F 30/17 (2020.01)

(56) References Cited

U.S. PATENT DOCUMENTS

| | | | | |
|---|---|---|---|---|
| 2020/0147813 | A1* | 5/2020 | Esfahani | B25J 19/068 |
| 2022/0332443 | A1* | 10/2022 | Roopnarine | B25J 15/0066 |
| 2023/0406546 | A1* | 12/2023 | Iwai | B64G 1/10 |

FOREIGN PATENT DOCUMENTS

| | | |
|---|---|---|
| CN | 110775306 A | 2/2020 |
| CN | 111470070 A | 7/2020 |
| CN | 114674179 A | 6/2022 |
| JP | 2011155267 A | 8/2011 |

OTHER PUBLICATIONS

First Office Action issued in counterpart Chinese Patent Application No. 202211151231.3, dated Oct. 31, 2022.
Grant Notification issued in counterpart Chinese Patent Application No. 202211151231.3, dated Nov. 9, 2022.
Sun et al., A Survey of Non-Cooperative Target Capturing Methods, Journal of National University of Defense Technology, 2020, 42(3), pp. 74-90, dated Jun. 28, 2020.
Wu et al., Dynamics and Control of Spacecraft with a Large Misaligned Rotational Component, Aerospace Science and Technology, 2019, pp. 207-217, dated Feb. 26, 2019.
Wu, Dynamics and Control of Rotating Scan Optical Satellites, Doctoral Thesis submitted to Harbin Institute of Technology, dated Feb. 28, 2022.
Yao, Capture Control of Space Robot for Non-Cooperative Targets, Master's Thesis submitted to Harbin Institute of Technology, dated Jun. 31, 2021.

* cited by examiner

METHOD AND APPARATUS FOR CAPTURING NON-COOPERATIVE TARGET USING SPACE ROBOTIC ARM, AND NON-TRANSITORY STORAGE MEDIUM

CROSS-REFERENCE TO RELATED APPLICATIONS

The present application is based on and claims the priority to Chinese Patent Application No. 202211151231.3, filed on Sep. 21, 2022, the disclosure of which is hereby incorporated by reference in its entirety.

TECHNICAL FIELD

The present application relates to the technical field of on-orbit servicing, particularly relates to a method and an apparatus for capturing a non-cooperative target using a space robotic arm, and a non-transitory storage medium.

BACKGROUND

With the increasing scale of development of space resources, a large number of satellites are currently stranded in space due to on-orbit failure, mission termination or other reasons. The satellites not only take up orbits but also may adversely affect the operation of a spacecraft in the orbit. By the end of 2021, over 80% of the on-orbit satellites in the world are low-orbit satellites, and it is necessary to conduct research on the deorbiting method for the low-orbit satellites. Currently, the deorbiting methods for the low-orbit satellites primarily include the deorbiting methods with drag ball, drag sail and electrodynamic tether respectively, and the deorbiting methods by electric propulsion and capture respectively. Compared to other deorbiting methods, the deorbiting method by capture has advantages such as high technical maturity and reliability. The capture may include non-contact capture, flexible capture and rigid capture. Among the three, the rigid capture is favored for its advantages such as being able to establish rigid connections, high flexibility, and convenient ground testing. For the traditional rigid capture, a mechanical device such as grapple and clamp is employed to capture a specific structure to establish a mechanical connection therewith. The capture through the mechanical connection can ensure high connection rigidity, but may also cause collision and a relatively complex control process for an actuator. Moreover, given the minimal effect of air resistance in space, failed satellites often fall into a self-spin due to the effects of initial controlling force and force from space environment, making the capture of the satellites more challenging.

SUMMARY

In view of this, the present disclosure provides a method, a device, an apparatus for capturing a non-cooperative target using a space robotic arm, and a non-transitory storage medium, wherein a magnetic capture device can be used as an end actuator of the space robotic arm so as to achieve the capture of the non-cooperative target.

According to a first aspect of the present disclosure, a method for capturing a non-cooperative target using a space robotic arm is provided. The method is applied to the space robotic arm with a magnetic capture device as the end actuator. The method includes:
establishing a magnetic attractive force model for the magnetic capture device and determining a magnetic attractive force characteristic of the magnetic capture device based on the magnetic attractive force model,
determine a capture strategy for the non-cooperative target based on the magnetic attractive force characteristic of the magnetic capture device, and
capturing the non-cooperative target according to the capture strategy and determining whether the non-cooperative target is captured based on a preset determination condition.

According to a second aspect of the present disclosure, a device for capturing a non-cooperative target using a space robotic arm is provided. The device includes:
a magnetic capture device, which is provided at an end of the space robotic arm and is configured for capturing the non-cooperative target,
an establishing part, which is configured for establishing a magnetic attractive force model for the magnetic capture device and determining a magnetic attractive force characteristic of the magnetic capture device based on the magnetic attractive force model,
a first determining part, which is configured for determining a capture strategy for the non-cooperative target based on the magnetic attractive force characteristic of the magnetic capture device, and
a second determining part, which is configured for capturing the non-cooperative target according to the capture strategy and determining whether the non-cooperative target is captured based on a preset determination condition.

According to a third aspect of the present disclosure, an apparatus for capturing a non-cooperative target using a space robotic arm is provided. The apparatus includes a magnetic capture device provided at an end of the space robotic arm, a memory and a processor, wherein
the memory is configured for storing computer-readable instructions capable of running on the processor, and
the processor is configured for performing the following steps by running the computer-readable instructions:
establishing a magnetic attractive force model for the magnetic capture device and determining a magnetic attractive force characteristic of the magnetic capture device based on the magnetic attractive force model,
determining a capture strategy for the non-cooperative target based on the magnetic attractive force characteristic of the magnetic capture device, and
controlling the magnetic capture device to capture the non-cooperative target according to the capture strategy and determining whether the non-cooperative target is captured based on a preset determination condition.

According to a fourth aspect of the present disclosure, a non-transitory storage medium is provided. The non-transitory storage medium has stored thereon computer-readable instructions that, when executed by a processor, cause the processor to perform the method for capturing the non-cooperative target using the space robotic arm as described in the first aspect.

The disclosure provides a method, a device, an apparatus for capturing a non-cooperative target using a space robotic arm, and a non-transitory storage medium. Based on the established magnetic attractive force model, the magnetic attractive force characteristic of the magnetic capture device is obtained. Based on the above-mentioned magnetic attractive force characteristic, the capture strategy for the non-cooperative target is determined, and the non-cooperative target is captured according to the determined capture strategy in the process that the magnetic capture device approaches the non-cooperative target. The magnetic capture device according to the present disclosure has a simple structure and is easy to perform capture and release operations. Through the capture method according to the present disclosure, the non-cooperative target can be approached and captured by virtue of the magnetic attractive force characteristic of the magnetic capture device, enabling a reliable capture process, and also reducing the damage to the space robotic arm.

DETAILED DESCRIPTION OF THE EMBODIMENTS

In the following, the present application will be described clearly and completely by way of exemplary embodiments in conjunction with the accompanying drawings.

At present, on-orbit servicing is realized mainly through mechanical connections. The capture of a non-cooperative target through the mechanical connection may ensure high connection rigidity, but may also cause a relatively high risk of collision and a relatively complex control process for an end actuator of a space robotic arm. Therefore, according to an embodiment of the present application, a capture device for capturing a non-cooperative target, which has a simple structure, high reliability, and is easy to perform capture and release operations, is provided.

It should be understood that in the embodiment of the present application, the non-cooperative target can be a defunct satellite, space debris or space junk.

Figure 1:
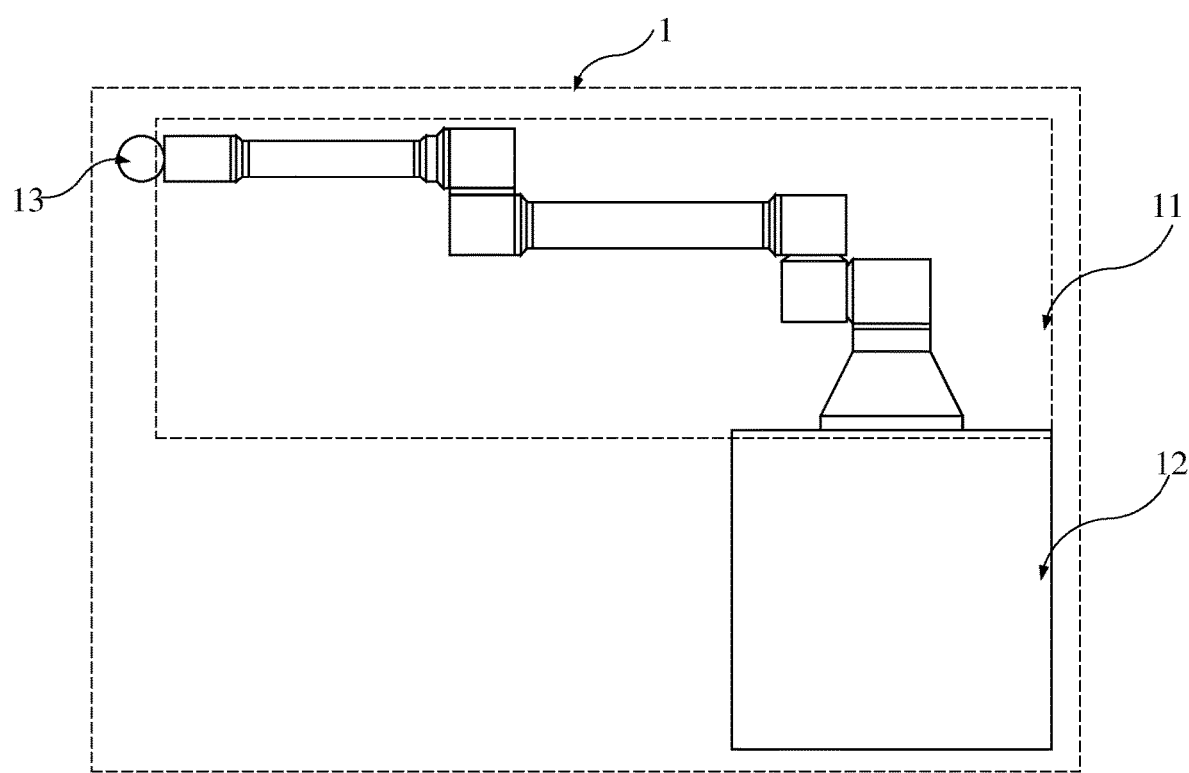
FIG. 1 is a schematic diagram of the structure of a space robotic arm according to an embodiment of the present application.

With reference to FIG. 1, which shows a space robotic arm 1 in which the technical solution in the embodiment of the present application can be applied, the space robotic arm 1 includes a seven-degree-of-freedom robotic arm 11, a base 12 and a cylindrical magnetic capture device 13 provided at an end of the seven-degree-of-freedom robotic arm 11. Joints of the seven-degree-of-freedom robotic arm 11 are all rotary joints, and the magnetic capture device 13 is used as the actuator to capture the non-cooperative target in space. In addition, the structure of the space robotic arm 1 shown in FIG. 1 is not specifically limited. In order to explain the technical solution in the embodiment of the present application clearly, other components of the space robotic arm 1 required for the capture of the non-cooperative target are omitted in FIG. 1.

Figure 2:
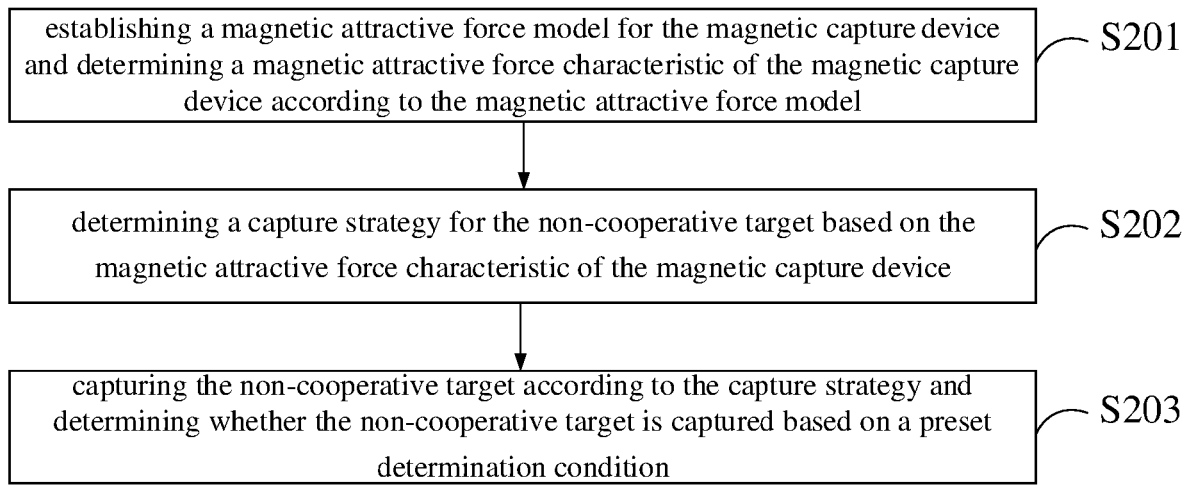
FIG. 2 is a schematic flow diagram of the method for capturing a non-cooperative target using a space robotic arm according to an embodiment of the present application.

Based on the exemplary structure of the space robotic arm 1 described above, a technical solution in which a non-cooperative target is captured using the magnetic capture device 13 as the end actuator is expected to be provided in embodiments of the present application, With reference to FIG. 2, which shows a method for capturing a non-cooperative target using a space robotic arm according to an embodiment of the present application, the method is applied to the space robotic arm with a magnetic capture device as the end actuator. The method includes the following steps:

S201: establishing a magnetic attractive force model for the magnetic capture device and determining a magnetic attractive force characteristic of the magnetic capture device according to the magnetic attractive force model.

S202: determining a capture strategy for the non-cooperative target based on the magnetic attractive force characteristic of the magnetic capture device.

S203: capturing the non-cooperative target according to the capture strategy and determining whether the non-cooperative target is captured based on a preset determination condition.

For the method described in FIG. 2, in some embodiments of the present application, the establishing a magnetic attractive force model for the magnetic capture device includes:
establishing the magnetic attractive force model for the magnetic capture device according to a magnetic attractive force applied by the magnetic capture device and a distance between a magnetic surface of the magnetic capture device and a captured surface of the non-cooperative target,
wherein the established magnetic attractive force model for the magnetic capture device is that:

$$F = k_1 \times e^{-l_1 \times x} + k_2 \times e^{-l_2 \times x} \tag{1}$$

wherein, F represents the magnetic attractive force applied by the magnetic capture device in N, x represents the distance between the magnetic surface of the magnetic capture device and the captured surface of the non-cooperative target in mm, and each of $k_1$, $k_2$, $l_1$ and $l_2$ represents a parameter to be fitted.

Accordingly, the determined magnetic attractive force characteristic of the magnetic capture device according to the magnetic attractive force model is specifically as follows. When the distance between the magnetic surface of the magnetic capture device and the captured surface of the non-cooperative target is small, the magnetic attractive force applied by the magnetic capture device is large, while, when the distance between the magnetic surface of the magnetic capture device and the captured surface of the non-cooperative target is large, the magnetic attractive force applied by the magnetic capture device is small.

It should be known that in the embodiment of the present application, a surface of the magnetic capture device 13 which is in contact with the non-cooperative target is referred to as the magnetic surface, and correspondingly, a surface of the non-cooperative target which is in contact with the above-mentioned magnetic surface is referred to as the captured surface.

It could be understood that in the specific implementation, the distance x between the magnetic surface of the magnetic capture device 13 and the captured surface of the non-cooperative target and the magnetic attractive force F applied by the magnetic capture device can be obtained based on factors such as the mass characteristic of the non-cooperative target and the strength of the seven-degree-of-freedom robotic arm 11. It could be understood that since it will take a long time for the space robotic arm 1 to approach the non-cooperative target, it is inevitable that the control of the activation of the magnetic capture device 13 is inaccurate. If the magnetic capture device 13 is activated too early, a disturbance torque will be applied on the non-cooperative target and may significantly affect the spin state of the non-cooperative target. Therefore, in the specific implementation, the magnetic capture device 13 could be activated when it is close to the non-cooperative target. In this way, the magnetic attractive force will be large due to the small distance of the magnetic capture device 13 from the non-cooperative target, so as to ensure the capture of the non-cooperative target, and the disturbance to the non-cooperative target could also be reduced.

However, in the specific implementation, when the distance between the magnetic surface of the magnetic capture device 13 and the captured surface of the non-cooperative target is 0, the magnetic attractive force applied by the magnetic capture device 13 is approximately 12000N, which will be a challenge to the structural strength of the space robotic arm 1, and will cause large acceleration on the non-cooperative target in the capture process and may eventually cause a serious collision therebetween. Therefore, in the specific implementation according to the embodiment of the present application, it is expected to set power levels according to the distance x between the magnetic surface of the magnetic capture device 13 and the captured surface of the non-cooperative target. Specifically, when the distance x is small, the power of the magnetic capture device 13 is reduced, so that the magnetic attractive force applied by the magnetic capture device 13 is small, while, when the distance x is large, the power of the magnetic capture device 13 is increased, so that the magnetic attractive force applied by the magnetic capture device 13 is large. However, considering the self-induction effect of coils in the magnetic capture device 13, the number of the power levels should not be excessive, and can be determined based on actual conditions.

For the method described in FIG. 2, in some embodiments of the present application, the determining a capture strategy for the non-cooperative target based on the magnetic attractive force characteristic of the magnetic capture device includes:

determining a second variation rule of a self-spin angular velocity of the non-cooperative target based on a first variation rule of a spacing distance between the magnetic surface of the magnetic capture device and a centroid of the non-cooperative target, obtaining a constraint condition for the spacing distance between the magnetic surface of the magnetic capture device and the centroid of the non-cooperative target based on the second variation rule of the self-spin angular velocity of the non-cooperative target, and determining the capture strategy for the non-cooperative target based on the magnetic attractive force characteristic of the magnetic capture device and the constraint condition, In some examples, the determining a second variation rule of a self-spin angular velocity of the non-cooperative target based on a first variation rule of the spacing distance between the magnetic surface of the magnetic capture device and a centroid of the non-cooperative target includes:

in the case that the non-cooperative target is assumed to be a square with side length d, determining that in the process where the magnetic capture device approaches and captures the non-cooperative target, the first variation rule of the spacing distance L between the magnetic surface of the magnetic capture device and the centroid of the non-cooperative target is that: L gradually varies from $$L = \frac{\sqrt{2}}{2} \times d \text{ to } L = \frac{1}{2} \times d,$$

and determining that in the process where L gradually varies from $$L = \frac{\sqrt{2}}{2} \times d \text{ to } L = \frac{1}{2} \times d,$$

the second variation rule of the self-spin angular velocity $\Omega$ of the non-cooperative target is that:

$$\Omega \leq \frac{\pi}{4T_1},$$

wherein, $T_1$ is a total time consumed from the start to the completion of the capture.

In some examples, the obtaining a constraint condition for the spacing distance between the magnetic surface of the magnetic capture device and the centroid of the non-cooperative target based on the second variation rule of the self-spin angular velocity of the non-cooperative target includes:

based on the second variation rule of the self-spin angular velocity of the non-cooperative target, when the maximum of the self-spin angular velocity is $$\frac{\pi}{4T_1},$$

in order to prevent a collision between the magnetic capture device and the non-cooperative target, determining that the constraint condition for the spacing distance L between the magnetic surface of the magnetic capture device and the centroid of the non-cooperative target is that:

$$L > \frac{d}{2 \times \sin\left(\frac{3\pi}{4} - \Omega \times t\right)} + r \times \tan\left(\frac{\pi}{4} - \Omega \times t\right) \quad (2)$$

wherein, t represents the time consumed in the capture process which starts from a capture zero timing at which $$\Omega = \frac{\pi}{4T_1}$$

the radius of the magnetic surface of the magnetic capture device.

Figure 3:
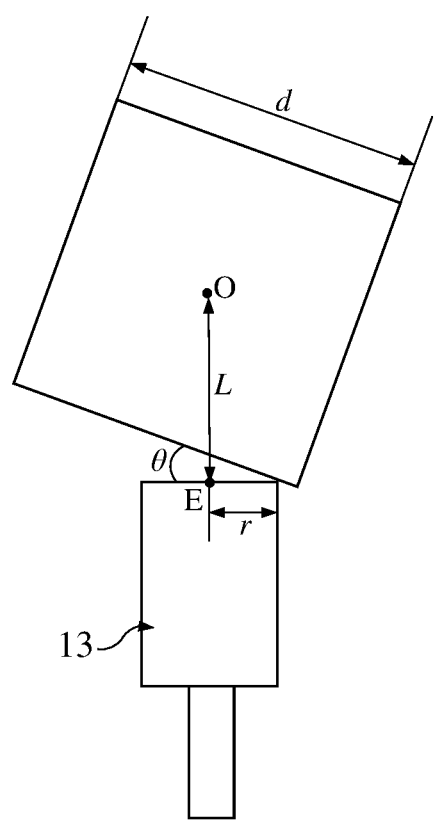
FIG. 3 is a schematic diagram showing the positional relationship between the magnetic capture device and the non-cooperative target in the capture process.

It could be understood that the non-cooperative target in failure is in self-spin state in space, therefore in the embodiment of the present application, the capture strategy is designed for the non-cooperative target in self-spin state. As shown in FIG. 3, the centroid of the non-cooperative target is O, the center of the magnetic surface of the magnetic capture device 13 is E, the spacing distance between O and E is L, and the angle between the magnetic surface of the magnetic capture device 13 and the captured surface of the non-cooperative target is θ. In the embodiment of the present application, it is assumed that the non-cooperative target is a square with a side length of d, and the radius of the bottom surface of the magnetic capture device 13 is r, when the space robotic arm 1 is maneuvered at a large angle relative to the non-cooperative target, $$L > \frac{\sqrt{2}}{2} \times d$$

will be met. A geometric constraint for the magnetic capture device 13 needs to be considered for the reason that the magnetic capture device 13 cannot be regarded as a point in the process of the space robotic arm 1 approaching the non-cooperative target. Specifically, it is assumed that the self-spin angular velocity of the non-cooperative target is Ω, the angle by which the non-cooperative target in self-spin state rotates should not be greater than $$\frac{\pi}{4}$$

in the process from $$L = \frac{\sqrt{2}}{2} \times d$$

to the completion of the capture $$\left(\text{i.e., } L = \frac{1}{2} \times d\right).$$

Otherwise, the non-cooperative target may collide with an edge of the bottom surface of the magnetic capture device 13 before being captured. Assuming that the total time consumed in the process from $$L = \frac{\sqrt{2}}{2} \times d$$

to the completion of the capture is $T_1$, the self-spin angular velocity of the non-cooperative target in self-spin state should meet the following expression:

$$\Omega \leq \frac{\pi}{4T_1}.$$

Figure 4:
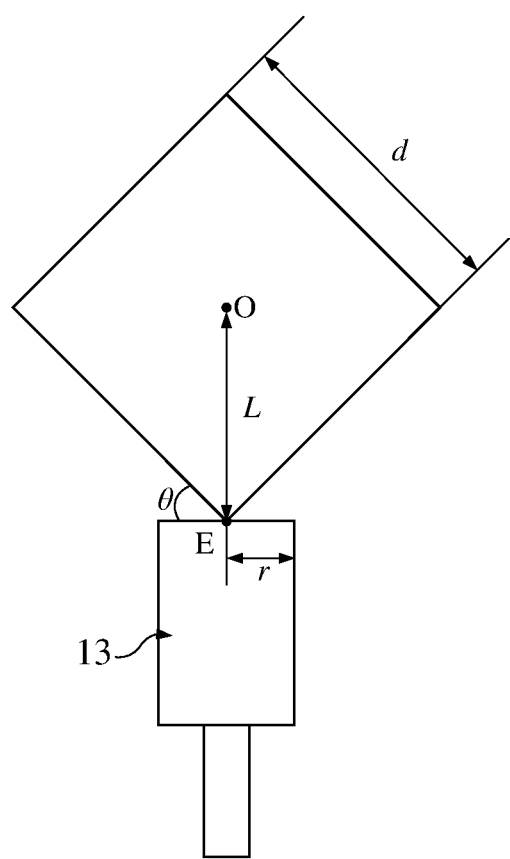
FIG. 4 is a schematic diagram showing the initial positional relationship between the magnetic capture device and the non-cooperative target under the condition where the self-spin angular velocity of the non-cooperative target is at its maximum.

Based on the above description, regarding the situation where the self-spin angular velocity of the non-cooperative target in self-spin state is at its maximum, i.e., $$\Omega = \frac{\pi}{4T_1},$$

the initial state of the capture process is as shown in FIG. 4. In order for the magnetic capture device 13 not to collide with the non-cooperative target in the capture process, L needs to meet the following expression:

$$L > \frac{d}{2 \times \sin\left(\frac{3\pi}{4} - \Omega \times t\right)} + r \times \tan\left(\frac{\pi}{4} - \Omega \times t\right) \quad (2)$$

In some examples, the determining the capture strategy for the non-cooperative target based on the magnetic attractive force characteristic of the magnetic capture device and the constraint condition includes the following step.

Based on the magnetic attractive force characteristic of the magnetic capture device and the constraint condition, determining a multistage capture strategy for the non-cooperative target. Specifically, in an initial stage of the approach of the magnetic capture device to the non-cooperative target, the magnetic capture device approaches the non-cooperative target quickly at a first speed and operates at a first power, and in a final stage of the approach of the magnetic capture device to the non-cooperative target, the magnetic capture device approaches the non-cooperative target slowly at a second speed which is smaller than the first speed and operates at a second power which is smaller than the first power.

Figure 5:
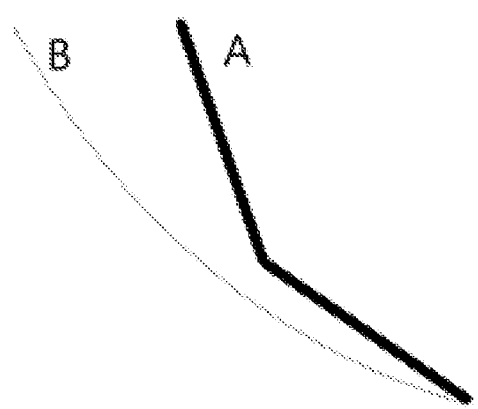
FIG. 5 is a schematic diagram showing the tendency of the curve corresponding to the constraint condition for the spacing distance L between the magnetic surface of the magnetic capture device and the captured surface of the non-cooperative target.

Based on the constraint condition that L needs to meet, the tendency of a curve corresponding to the constraint condition can be obtained, as shown by the curve B in FIG. 5. It can be seen from FIG. 5 that the curve B is a trigonometric curve. If the magnetic capture device 13 is controlled such that the magnetic capture device approaches the non-cooperative target in accordance with the trigonometric variation shown by curve B, the difficulty of controlling the space robotic arm 1 would be increased and the control accuracy would also be difficult to be ensured. Therefore, according to an embodiment of the present application, a "multistage"

approach strategy is proposed. The number of the stages can be determined according to actual conditions. The curve A in FIG. 5 schematically shows that the magnetic capture device 13 approaches the non-cooperative target at "two speeds". Specifically, in the initial stage of the approach of the magnetic capture device to the non-cooperative target, the magnetic capture device 13 approaches the non-cooperative target at the relatively high first speed $v_1$ and operates at the first power, while, in the final stage of the approach of the magnetic capture device to the non-cooperative target, the magnetic capture device 13 approaches the non-cooperative target at the relatively low second speed $v_2$ and operates at the second power. With the multistage approach strategy, when the distance from the magnetic capture device to the non-cooperative target is relatively large, the speed at which the magnetic capture device 13 approaches the non-cooperative target is relatively high, and the power of the magnetic capture device is relatively high, causing that the magnetic attractive force applied by the magnetic capture device is relatively large and the control accuracy is relatively low, and when the distance from the magnetic capture device to the non-cooperative target is relatively small, the speed at which the magnetic capture device approaches the non-cooperative target is relatively low, and the power of the magnetic capture device is relatively low, causing that the magnetic attractive force applied by the magnetic capture device 13 is relatively small and the control accuracy is relatively high, thus achieving a balance between efficiency and accuracy.

For the method shown in FIG. 2, in some embodiments of the present application, the capturing the non-cooperative target according to the capture strategy and determining whether the non-cooperative target is captured based on a preset determination condition includes: in the capture of the non-cooperative target according to the capture strategy, determining that the non-cooperative target is captured when the following preset determination conditions are all met.

The distance between the magnetic surface of the magnetic capture device and the captured surface of the non-cooperative target ranges from 0 to $10^{-4}$ m, and the speed of the magnetic capture device relative to the non-cooperative target ranges from 0 to $10^{-3}$ m/s.

Figure 6:
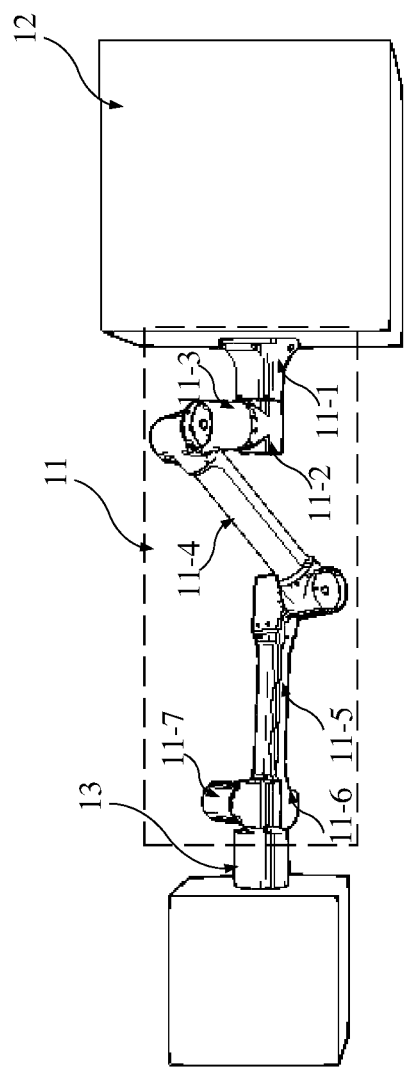
FIG. 6 is a schematic diagram showing the positional relationship between the magnetic capture device and the non-cooperative target when being captured.

It could be understood that when the space robotic arm 1 is maneuvered at a large angle to the non-cooperative target, the magnetic capture device 13 will gradually approach the non-cooperative target, and the non-cooperative target is still in self-spin state. When the normal vector $n_1$ of the bottom surface of the magnetic capture device 13 and the normal vector $n_2$ of the captured surface of the non-cooperative target are about to become collinear, the distance between the magnetic surface of the magnetic capture device 13 and the captured surface of the non-cooperative target is reduced to a preset distance at which the magnetic capture device 13 is activated. In this case, the magnetic capture device 13 is energized to produce a magnetic attractive force so as to attract the non-cooperative target using the "multistage" capture strategy and complete the capture. The state of the non-cooperative target being captured is shown in FIG. 6. When the non-cooperative target is captured, the distance between the non-cooperative target and the magnetic capture device and the speed of the non-cooperative target relative to the magnetic capture device are both zero.

According to the embodiments of the present application, the magnetic attractive force model for the magnetic capture device is established according to the magnetic attractive force applied by the magnetic capture device 13 and the distance between the magnetic surface of the magnetic capture device 13 and the captured surface of the non-cooperative target, the magnetic attractive force characteristic of the magnetic capture device 13 is obtained according to the established magnetic attractive force model and the power levels of the magnetic capture device 13 are set based on the magnetic attractive force characteristic. Additionally, in the process that the magnetic capture device approaches the non-cooperative target, the constraint condition for the spacing distance between the magnetic capture device 13 and the centroid of the non-cooperative target is obtained. Then, based on the above magnetic attractive force characteristic and constraint condition, the multistage approach strategy is determined. In the approach process, when the distance from the magnetic capture device to the non-cooperative target is relatively large, the speed of the magnetic capture device 13 is relatively high, and the power of the magnetic capture device 13 is increased to increase the magnetic attractive force, and when the distance from the magnetic capture device to the non-cooperative target is relatively small, the speed of the magnetic capture device 13 is relatively low, and the power of the magnetic capture device 13 is reduced to reduce the magnetic attractive force, so as to prevent the force from exceeding the limit of the structural strength of the space robotic arm 1. The magnetic capture device 13 according to the embodiments of the present application has a simple structure and is easy to perform capture and release operations. The magnetic capture device 13 can approach the non-cooperative target in the multistage manner using its the magnetic attractive force characteristic, ensuring a reliable capture process, and also reducing the damage to the space robotic arm.

The embodiments of the present application will be explained in detail below by way of specific simulation analysis process and results.

Reference is made to Table 1, which shows the magnitude of the magnetic attractive force applied by the magnetic capture device 13 when the power of the magnetic capture device 13 is 80 W.

TABLE 1

| | Distance x/mm | | | | | | | | |
|---|---|---|---|---|---|---|---|---|---|
| | 1 | 2 | 3 | 4 | 5 | 6 | 7 | 8 | 10 |
| Magnetic attractive force/N | 4200 | 1800 | 1000 | 650 | 400 | 300 | 250 | 200 | 100 |

By fitting the magnetic attractive force data and the distance data in Table 1, the following expression will be met when the power of the magnetic capture device 13 is 80 W.

$$F = 10140 \times e^{-1.278x} + 1842 \times e^{-0.2939x}$$

Reference is made to Table 2, which shows parameters relevant to the non-cooperative target.

TABLE 2

| Mass/kg | Size/mm | Moment of inertia matrix/kg · m$^2$ | Self-spin angular velocity/rad · s$^{-1}$ |
|---|---|---|---|
| 10 | 300 × 300 × 300 | $\begin{bmatrix} 10 & 0 & 0 \\ 0 & 10 & 0 \\ 0 & 0 & 10 \end{bmatrix}$ | $\dfrac{\pi}{60}$ |

Reference is made to Table 3, which shows parameters relevant to the space robotic arm 1, where the size of the base 12 is 500 mm×500 mm×500 mm.

TABLE 3

| Part | Mass/kg | $I_x$/ kg · m$^2$ | $I_y$/ kg · m$^2$ | $I_z$/ kg · m$^2$ | $I_{xy}$/ kg · m$^2$ | $I_{xz}$/ kg · m$^2$ | $I_{yz}$/ kg · m$^2$ |
|---|---|---|---|---|---|---|---|
| Base | 39.377 | 2.5973 | 2.5973 | 2.5975 | 6.1204 × 10$^{-11}$ | 1.8815 × 10$^{-10}$ | 9.8927 × 10$^{-12}$ |
| Rod 11-1 | 0.46951 | 0.00052398 | 0.00050311 | 0.00050944 | 0 | 0 | 0 |
| Rod 11-2 | 0.46951 | 0.00052398 | 0.00050311 | 0.00050944 | 0 | 0 | 0 |
| Rod 11-3 | 1.2228 | 0.0013031 | 0.003941 | 0.0039119 | 0 | 0 | 0 |
| Rod 11-4 | 0.7016 | 0.00073596 | 0.0024653 | 0.0024339 | 0 | 0 | 0 |
| Rod 11-5 | 0.28793 | 0.00023932 | 0.00024444 | 0.00022454 | 0 | 0 | 0 |
| Rod 11-6 | 0.28793 | 0.00023932 | 0.00024444 | 0.00022454 | 0 | 0 | 0 |
| Rod 11-7 | 6.2995 | 0.009167 | 0.009167 | 0.0078619 | 0 | 0 | 0 |

Figure 7:
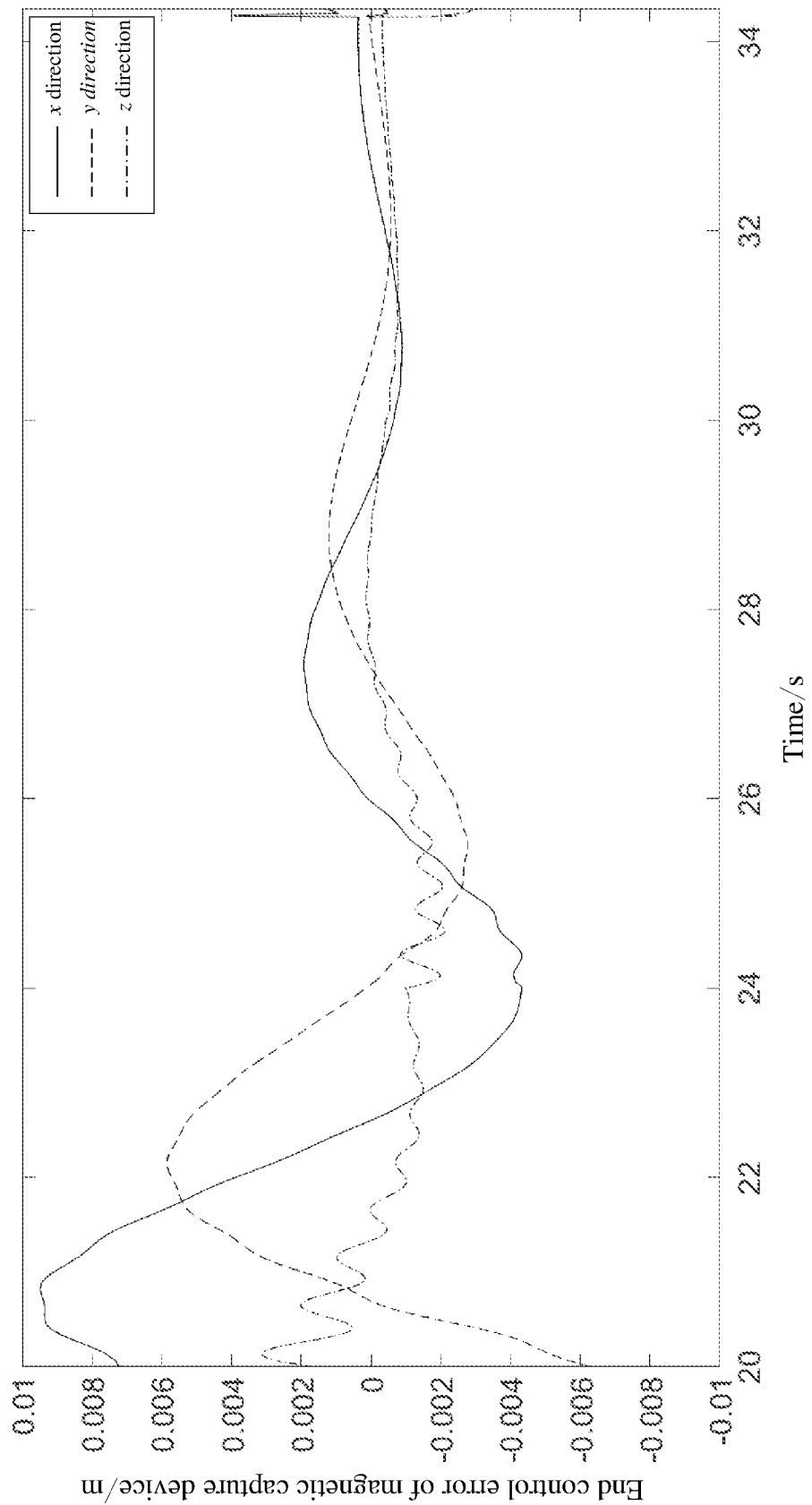
FIG. 7 is a schematic diagram showing the tendency of the control error of the magnetic capture device over time.
Figure 8:
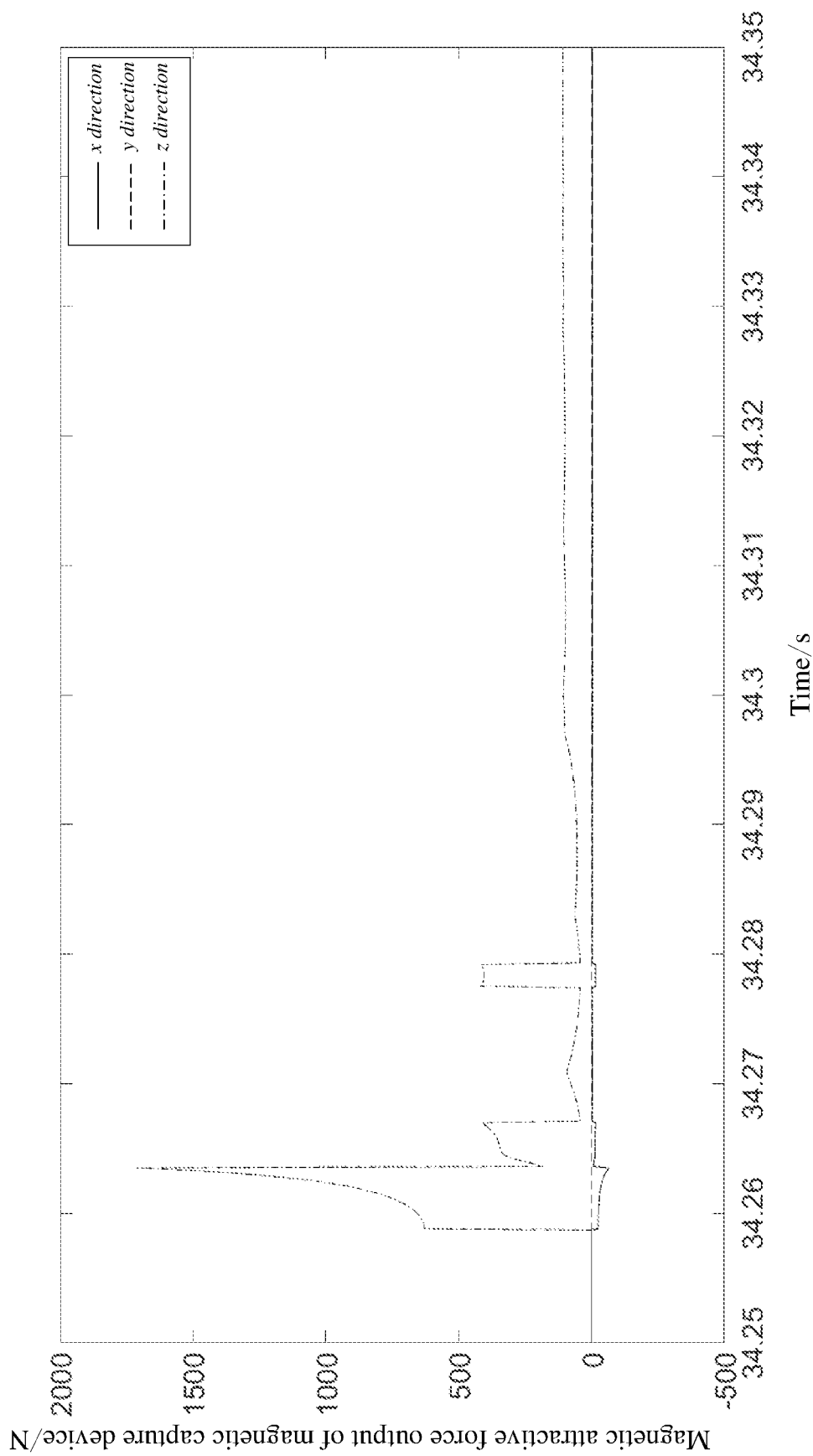
FIG. 8 is a schematic diagram showing the tendency of the magnetic attractive force outputted by the magnetic capture device over time.

FIG. 7 schematically shows the variation in control error of the magnetic capture device 13 before the capture. Assuming that the distance between the magnetic capture device 13 and the captured surface of the non-cooperative target before the capture is 3 mm, with reference to FIG. 8 which shows output of the magnetic attractive force of the magnetic capture device 13, by analyzing the output of the magnetic attractive force of the magnetic capture device in FIG. 8, it can be known that the maximum of the magnetic attractive force outputted by the magnetic capture device is about 1760N, and the magnitude of the force outputted stabilizes eventually at about 107N, thus it can be determined that the stabilized output is the output of the force after the capture.

Figure 9:
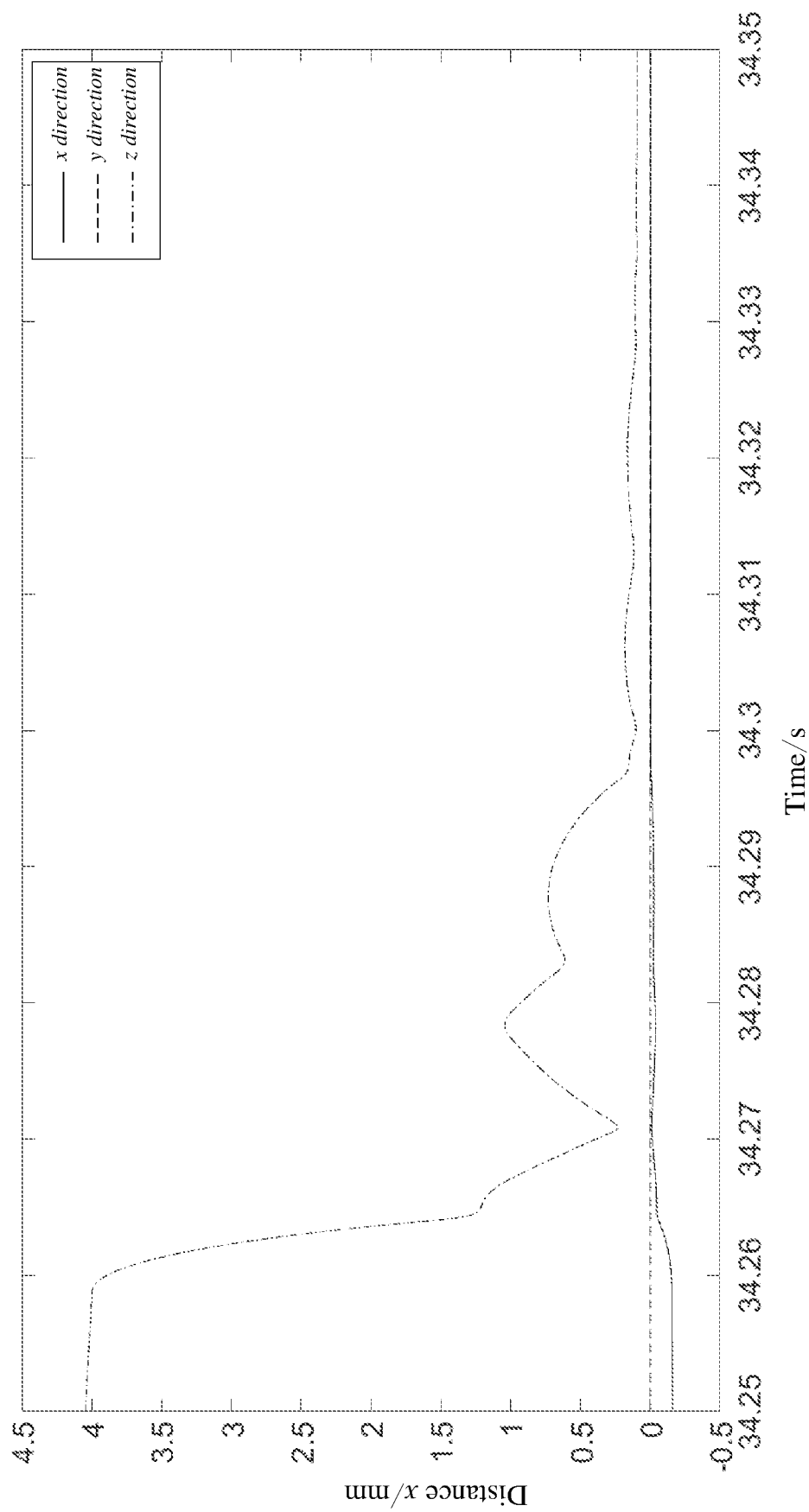
FIG. 9 is a schematic diagram showing the tendency of the distance between the magnetic surface of the magnetic capture device and the captured surface of the non-cooperative target over time.
Figure 10:
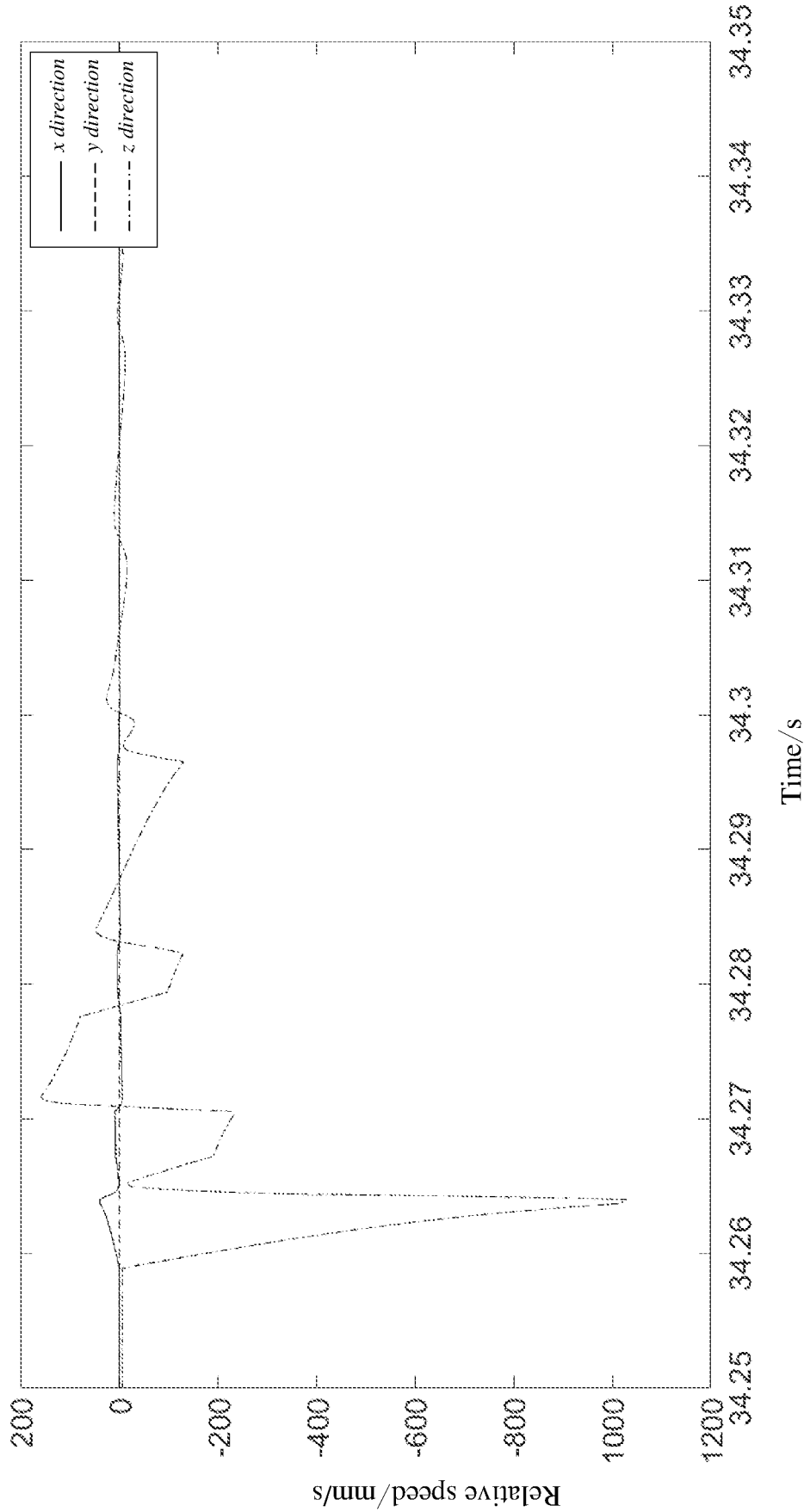
FIG. 10 is a schematic diagram showing the tendency of the velocity of the magnetic capture device relative to the non-cooperative target over time.

Reference is made to FIG. 9, which schematically shows the variation of the distance between the magnetic capture device 13 and the captured surface of the non-cooperative target. By analyzing the distance in FIG. 9, it can be known that the magnetic capture device 13 has collided with the non-cooperative target several times. Due to the self-spin state of the non-cooperative target, there are irregular peaks in the curve shown in FIG. 9. Reference is made to FIG. 10, which shows the speed of the magnetic capture device 13 relative to the non-cooperative target. It can be known from FIG. 9 and FIG. 10, at the moment of capturing the non-cooperative target by the magnetic capture device, there is a collision between the magnetic capture device and the non-cooperative target, causing a jump in relative speed therebetween. The relative speed is eventually stabilized under the magnetic attractive force applied by the magnetic capture device 13. Upon analysis, the spacing distance and the relative speed between the magnetic capture device 13 and the non-cooperative target shown in FIG. 9 and FIG. 10 respectively meet the determination conditions for the capture. Therefore, it can be determined that the non-cooperative target is captured by the magnetic capture device 13.

It should be explained that in the simulation analysis according to the embodiment of the present application, the space robotic arm 1 firstly is maneuvered at a large angle, and then undergoes a stability control for a period of time. After the control error is reduced to a certain range, the approach and the capture of the non-cooperative target are carried out according to the set multistage capture strategy. Eventually, under the action of the magnetic capture device 13, the space robotic arm 1 and the non-cooperative target become a combination. In the capture process, the control error is acceptable and the effect of the capture is good.

Figure 11:
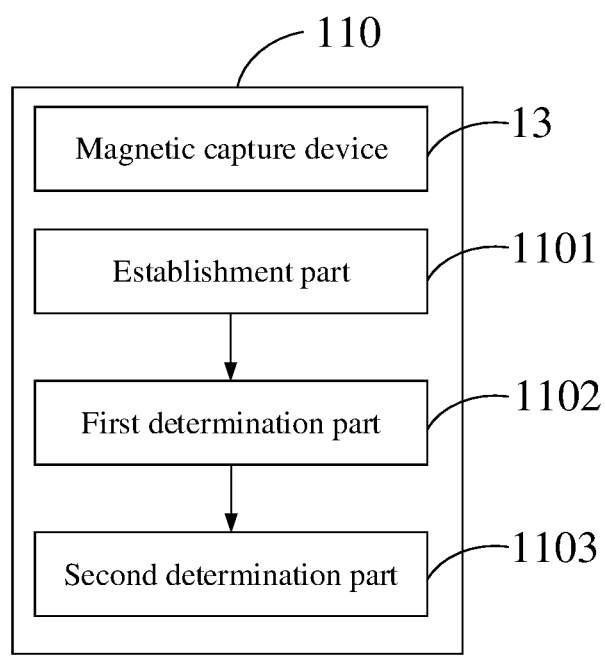
FIG. 11 is a schematic diagram showing the composition of a device for capturing a non-cooperative target using a space robotic arm according to an embodiment of the present application.

Based on the same inventive concept as that in the above technical solution, as shown in FIG. 11, a device 110 for capturing a non-cooperative target using a space robotic arm is provided according to an embodiment of the present application. The device 110 includes a magnetic capture device 13, an establishment part 1101, a first determination part 1102 and a second determination part 1103.

The magnetic capture device 13 is provided at an end of the space robotic arm and is configured for capturing the non-cooperative target.

The establishment part 1101 is configured for establishing a magnetic attractive force model for the magnetic capture device and determining a magnetic attractive force characteristic of the magnetic capture device based on the magnetic attractive force model.

The first determination part 1102 is configured for determining a capture strategy for the non-cooperative target based on the magnetic attractive force characteristic of the magnetic capture device.

The second determination part 1103 is configured for capturing the non-cooperative target based on the capture strategy and determining whether the non-cooperative target is captured according to a preset determination condition.

It should be explained that for the specific implementation of or the example for embodying the functions for which the above components are configured, reference can be made to the corresponding steps, implementations and examples in the aforementioned technical solutions, which will be not described in detail in the embodiment of the present application.

It could be understood that in the embodiment, "part" can be a circuit part, a processor part, a program or software part, etc., and of course, can also be a unit, or can be a module or non-modular.

Moreover, in the embodiment, all the components can be integrated in a single processing unit, or each component can exist physically separately, or two or more of the components can be integrated in a single unit. The integrated unit can be implemented either in the form of hardware or in the form of software functional modules.

If the integrated unit is implemented in the form of software functional module and is not sold or used as an independent product, it can be stored in a computer-readable non-transitory storage medium. Based on this understanding, the part of the technical solution in the embodiment that makes substantial contributions to the prior art or the whole or part of the technical solution can be embodied in the form of a computer software product. This computer software product is stored in a non-transitory storage medium, including several instructions for making a computer device (which could be a personal computer, server, or network device, etc.) or a processor execute all or part of the steps of the method described in the embodiment. The aforementioned non-transitory storage medium includes USB flash drive, portable hard drive, read-only memory (ROM), random access memory (RAM), magnetic disk or optical disk, and various other mediums that can store program code.

Therefore, a non-transitory storage medium is provided according to an embodiment of the present application, which has stored thereon computer-readable instructions that, when executed by a processor, cause the processor to perform the method for capturing the non-cooperative target using the space robotic arm in the aforementioned technical solution.

Figure 12:
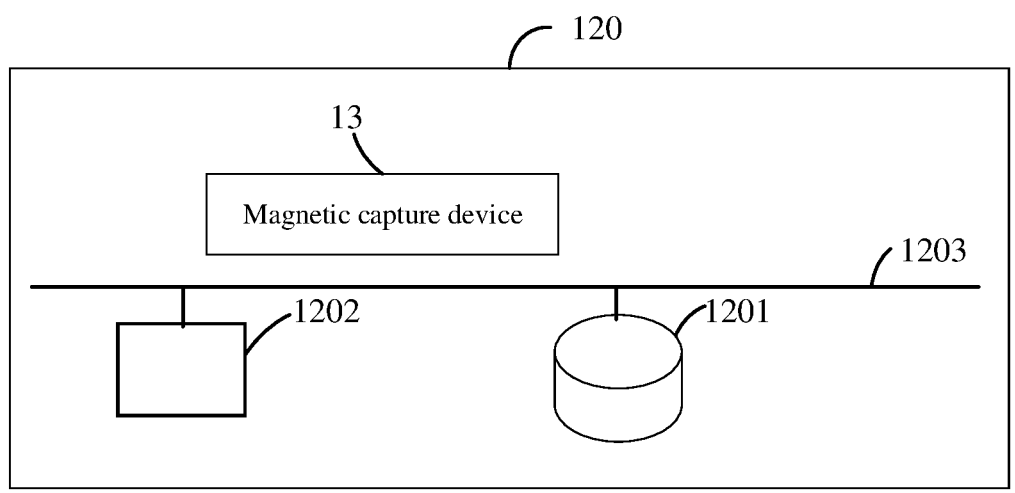
FIG. 12 is a schematic diagram showing the composition of an apparatus for capturing a non-cooperative target using a space robotic arm according to an embodiment of the present application.

According to the device 110 for capturing a non-cooperative target using a space robotic arm and the non-transitory storage medium, as shown in FIG. 12, as a specific hardware structure, an apparatus 120 in which the device 110 for capturing a non-cooperative target using a space robotic arm can be applied is provided according to an embodiment of this application. The apparatus 120 can be applied to the space robotic arm 1 shown in FIG. 1. The apparatus 120 may include a magnetic capture device 13 provided at an end of the space robotic arm, a memory 1201 and a processor 1202. Besides the magnetic capture device 13 being provided at the end of the space robotic arm 1, the other components can be coupled together through a bus system 1203. It could be understood that the bus system 1203 is used for the connection communication between these components. The bus system 1203 includes not only a data bus but also a power bus, a control bus, and a status signal bus. However, for the sake of clarity, all these kinds of buses are referred to as the bus system 1203 in FIG. 12.

The memory 1201 is configured for storing computer-readable instructions capable of running on the processor.

The processor 1202 is configured for performing the following steps by running the computer-readable instructions:

establishing a magnetic attractive force model for the magnetic capture device and determining a magnetic attractive force characteristic of the magnetic capture device based on the magnetic attractive force model, determining a capture strategy for the non-cooperative target based on the magnetic attractive force characteristic of the magnetic capture device, and controlling the magnetic capture device to capture the non-cooperative target based on the capture strategy, and determining whether the non-cooperative target is captured according to a preset determination condition.

It could be understood that in the embodiment, the memory 1201 can be either a volatile memory or a non-volatile memory, or include both a volatile memory and a non-volatile memory. Non-volatile memory can be Read-Only Memory (ROM), Programmable ROM (PROM), Erasable PROM (EPROM), Electrically EPROM (EEPROM), or flash memory. Volatile memory can be Random Access Memory (RAM), which is used as external high-speed cache. As illustrative examples, but not limited thereto, many forms of RAM can be used, such as static RAM (SRAM), dynamic RAM (DRAM), synchronous DRAM (SDRAM), double data rate SDRAM (DDRSDRAM), enhanced SDRAM (ESDRAM), synchlink DRAM (SLDRAM), and direct rambus RAM (DRRAM). The memory 1201 mentioned in the system and method described herein is intended to include but not limited to these and any other suitable types of memory.

The processer 1202 can be an integrated circuit chip with signal processing capability. In the implementation, the various steps of the above method can be completed by an integrated logic circuit in the form of hardware in the processer 1202 or instructions in the form of software. The processor 1202 can be a general-purpose processor, digital signal processor (DSP), application-specific integrated circuit (ASIC), field-programmable gate array (FPGA), or other programmable logic devices, discrete gates, transistor logic devices, discrete hardware components, or any combination thereof. The general-purpose processor may be a microprocessor or the processor may also be any conventional processor, etc. The disclosed methods in the embodiment of the present application can be executed directly by the hardware in a decoding processor, or can be executed by the combination of the hardware or software modules in a decoding processor. The software module can exist in common storage media such as random-access memory, flash memory, read-only memory, programmable read-only memory, electrically erasable programmable memory or registers. The non-transitory storage medium is in the memory 1201, and the processor 1202 reads the information from the memory 1201 and executes the above method in conjunction with its hardware.

It could be understood that the embodiments described herein can be implemented using hardware, software, firmware, middleware, microcode, or a combination thereof. For the implementation in hardware, the processing unit can be implemented in one or more application specific integrated circuits (ASICs), digital signal processors (DSPs), DSP devices (DSPDs), programmable logic devices (PLDs), field-programmable gate arrays (FPGAs), general-purpose processors, controllers, microcontrollers, microprocessors, other electronic units for performing the functions disclosed herein, or a combination thereof.

For the implementation in software, the method described herein can be implemented using modules (e.g., procedures, functions, etc.) that perform the functions described herein. The software code can be stored in the memory and executed by the processor. The memory can be implemented inside or outside the processor.

Specifically, processor 1202 is also configured to execute the method for capturing a non-cooperative target using the space robotic arm in the aforementioned technical solution by running the computer-readable instructions, which will not be further elaborated here.

It should be known that any combination of the technical solutions disclosed in the embodiments of the present application can be made without conflict.

While the present application has been described with reference to the exemplary embodiments, it should be understood that the present application is not limited to the specific embodiments/examples described and illustrated in detail herein, and those skilled in the art can image any variation or substitution of the exemplary embodiments without departing from the protection scope defined by the claims.

What is claimed is:

1. A method for capturing a target using a space robotic arm, the method being applied to the space robotic arm with a magnetic capture device as an end actuator and the method comprising:
establishing a magnetic attractive force model for the magnetic capture device and determining a magnetic attractive force characteristic of the magnetic capture device according to the magnetic attractive force model, wherein the establishing a magnetic attractive force model for the magnetic capture device comprises:
establishing the magnetic attractive force model for the magnetic capture device according to a magnetic attractive force applied by the magnetic capture device and a distance between a magnetic surface of the magnetic capture device and a captured surface of the target,
wherein the established magnetic attractive force model for the magnetic capture device is that:

$$F = k_1 \times e^{-l_1 \times x} + k_2 \times e^{-l_2 \times x}$$

wherein, F represents the magnetic attractive force applied by the magnetic capture device in Newtons, x represents the distance between the magnetic surface of the magnetic capture device and the captured surface of the target in millimeters, and each of $k_1$, $k_2$, $l_1$, and $l_2$ represent a parameter to be fitted to a non-zero value, and
the determining a magnetic attractive force characteristic of the magnetic capture device according to the magnetic attractive force model is that:
when the distance between the magnetic surface of the magnetic capture device and the captured surface of the target is smaller than a predetermined distance threshold, the magnetic attractive force applied by the magnetic capture device is larger than a predetermined force threshold, while, when the distance between the magnetic surface of the magnetic capture device and the captured surface of the target is larger than the predetermined distance threshold, the magnetic attractive force applied by the magnetic capture device is smaller than the predetermined force threshold, and
determining a capture strategy for the target based on the magnetic attractive force characteristic of the magnetic capture device, and
capturing the target according to the capture strategy and determining whether the target is captured based on a preset determination condition.

2. The method according to claim 1, wherein the determining a capture strategy for the target based on the magnetic attractive force characteristic of the magnetic capture device comprises:
determining a self-spin angular velocity of the target based on a spacing distance between the magnetic surface of the magnetic capture device and a centroid of the target,
obtaining a constraint condition for the spacing distance between the magnetic surface of the magnetic capture device and the centroid of the target based on the self-spin angular velocity of the target, and
determining the capture strategy for the non cooperative-target based on the magnetic attractive force characteristic of the magnetic capture device and the constraint condition.

3. The method according to claim 2, wherein, the determining a self-spin angular velocity of the target based on a spacing distance between the magnetic surface of the magnetic capture device and a centroid of the target comprises:
in the case that the target is assumed to be a square with side length d, determining that in the process where the magnetic capture device approaches and captures the target, the spacing distance L between the magnetic surface of the magnetic capture device and the centroid of the target is that: L gradually varies from $$L = \frac{\sqrt{2}}{2} \times d \text{ to } L = \frac{1}{2} \times d,$$

and
determining that in the process where L gradually varies from $$L = \frac{\sqrt{2}}{2} \times d \text{ to } L = \frac{1}{2} \times d,$$

the self-spin angular velocity $\Omega$ of the target is that:

$$\Omega \leq \frac{\pi}{4T_1},$$

wherein, $T_1$ is a total time consumed from the start to the completion of the capture.

4. The method according to claim 3, wherein the obtaining a constraint condition for the spacing distance between the magnetic surface of the magnetic capture device and the centroid of the target based on the self-spin angular velocity of the target comprises:
based on the self-spin angular velocity of the target, when the maximum of the self-spin angular velocity $\Omega$ is $$\frac{\pi}{4T_1},$$

in order to prevent a collision between the magnetic capture device and the target, determining that the constraint condition for the spacing distance L between the magnetic surface of the magnetic capture device and the centroid of the target is that:

$$L > \frac{d}{2 \times \sin\left(\frac{3\pi}{4} - \Omega \times t\right)} + r \times \tan\left(\frac{\pi}{4} - \Omega \times t\right)$$

wherein, t represents the time consumed in the capture process which starts from a capture zero timing at which $$\Omega = \frac{\pi}{4T_1}$$

is reached, and r represents the radius of the magnetic surface of the magnetic capture device.

5. The method according to claim 2, wherein the determining the capture strategy for the target based on the magnetic attractive force characteristic of the magnetic capture device and the constraint condition comprises:
  based on the magnetic attractive force characteristic of the magnetic capture device and the constraint condition, determining a multistage capture strategy for the target, wherein
  in an initial stage of the approach of the magnetic capture device to the target, the magnetic capture device approaches the target at a first speed that is larger than a predetermined speed threshold and operates at a first power, and
  in a final stage of the approach of the magnetic capture device to the target, the magnetic capture device approaches the target at a second speed which is smaller than the first speed and operates at a second power which is smaller than the first power.

6. The method according to claim 1, wherein the capturing the target according to the capture strategy and determining whether the target is captured based on a preset determination condition comprises:
  in the capture of the target according to the capture strategy, determining that the target is captured when the following preset determination conditions are all met:
  the distance between the magnetic surface of the magnetic capture device and the captured surface of the target ranges from 0 to $10^{-4}$ meters, and
  the speed of the magnetic capture device relative to the target ranges from 0 to $10^{-3}$ meters per second.

7. An apparatus for capturing a target using a space robotic arm, the apparatus comprising a magnetic capture device provided at an end of the space robotic arm, a memory and a processor, wherein
  the memory is configured for storing computer-readable instructions capable of running on the processor, and
  the processor is configured for performing the following steps by running the computer-readable instructions:
  establishing a magnetic attractive force model for the magnetic capture device and determining a magnetic attractive force characteristic of the magnetic capture device according to the magnetic attractive force model, wherein the establishing a magnetic attractive force model for the magnetic capture device comprises:
  establishing the magnetic attractive force model for the magnetic capture device according to a magnetic attractive force applied by the magnetic capture device and a distance between a magnetic surface of the magnetic capture device and a captured surface of the target,
  wherein the established magnetic attractive force model for the magnetic capture device is that:

$F = k_1 \times e^{-l_1 \times x} + k_2 \times e^{-l_2 \times x}$ wherein, F represents the magnetic attractive force applied by the magnetic capture device in Newtons, x represents the distance between the magnetic surface of the magnetic capture device and the captured surface of the target in millimeters, and each of $k_1$, $k_2$, $l_1$, and $l_2$, represent a parameter to be fitted to a non-zero value, and
  the determining a magnetic attractive force characteristic of the magnetic capture device according to the magnetic attractive force model is that:
  when the distance between the magnetic surface of the magnetic capture device and the captured surface of the target is smaller than a predetermined distance threshold, the magnetic attractive force applied by the magnetic capture device is larger than a predetermined force threshold, while, when the distance between the magnetic surface of the magnetic capture device and the captured surface of the target is larger than the predetermined distance threshold, the magnetic attractive force applied by the magnetic capture device is smaller than the predetermined force threshold, and
  determining a capture strategy for the target based on the magnetic attractive force characteristic of the magnetic capture device, and
  controlling the magnetic capture device to capture the target according to the capture strategy, and determining whether the target is captured based on a preset determination condition.

8. The apparatus according to claim 7, wherein the determining a capture strategy for the target based on the magnetic attractive force characteristic of the magnetic capture device comprises:
  determining a self-spin angular velocity of the target based on a spacing distance between the magnetic surface of the magnetic capture device and a centroid of the target,
  obtaining a constraint condition for the spacing distance between the magnetic surface of the magnetic capture device and the centroid of the target based on the self-spin angular velocity of the target, and
  determining the capture strategy for the target based on the magnetic attractive force characteristic of the magnetic capture device and the constraint condition.

9. The apparatus according to claim 8, wherein, the determining a self-spin angular velocity of the target based on a spacing distance between the magnetic surface of the magnetic capture device and a centroid of the target comprises:
  in the case that the target is assumed to be a square with side length d, determining that in the process where the magnetic capture device approaches and captures the target, the spacing distance L between the magnetic surface of the magnetic capture device and the centroid of the target is that: L gradually varies from $$L = \frac{\sqrt{2}}{2} \times d \text{ to } L = \frac{1}{2} \times d,$$

and
  determining that in the process where L gradually varies from $$L = \frac{\sqrt{2}}{2} \times d \text{ to } L = \frac{1}{2} \times d,$$

the self-spin angular velocity Ω of the target is that:

$$\Omega \leq \frac{\pi}{4T_1},$$

wherein, $T_1$ is a total time consumed from the start to the completion of the capture.

10. The apparatus according to claim 9, wherein the obtaining a constraint condition for the spacing distance between the magnetic surface of the magnetic capture device and the centroid of the target based on the self-spin angular velocity of the target comprises:

based on the self-spin angular velocity of the target, when the maximum of the self-spin angular velocity $\Omega$ is $$\frac{\pi}{4T_1},$$

in order to prevent a collision between the magnetic capture device and the target, determining that the constraint condition for the spacing distance L between the magnetic surface of the magnetic capture device and the centroid of the target is that:

$$L > \frac{d}{2\times\sin\left(\frac{3\pi}{4}-\Omega\times t\right)} + r\times\tan\left(\frac{\pi}{4}-\Omega\times t\right)$$

wherein, t represents the time consumed in the capture process which starts from a capture zero timing at which $$\Omega = \frac{\pi}{4T_1}$$

is reached, and r represents the radius of the magnetic surface of the magnetic capture device.

11. The apparatus according to claim 8, wherein the determining the capture strategy for the target based on the magnetic attractive force characteristic of the magnetic capture device and the constraint condition comprises:

based on the magnetic attractive force characteristic of the magnetic capture device and the constraint condition, determining a multistage capture strategy for the target, wherein in an initial stage of the approach of the magnetic capture device to the target, the magnetic capture device approaches the target at a first speed that is larger than a predetermined speed threshold and operates at a first power, and in a final stage of the approach of the magnetic capture device to the target, the magnetic capture device approaches the target at a second speed which is smaller than the first speed and operates at a second power which is smaller than the first power.

12. The apparatus according to claim 7, wherein the capturing the target according to the capture strategy and determining whether the target is captured based on a preset determination condition comprises:

in the capture of the target according to the capture strategy, determining that the target is captured when the following preset determination conditions are all met:

the distance between the magnetic surface of the magnetic capture device and the captured surface of the target ranges from 0 to $10^{-4}$ meters, and the speed of the magnetic capture device relative to the target ranges from 0 to $10^{-3}$ meters per second.

13. A non-transitory storage medium having stored thereon computer-readable instructions that, when executed by a processor, cause the processor to perform a method for capturing a target using a space robotic arm, the method being applied to the space robotic arm with a magnetic capture device as an end actuator and the method comprising:

establishing a magnetic attractive force model for the magnetic capture device and determining a magnetic attractive force characteristic of the magnetic capture device according to the magnetic attractive force model, wherein the establishing a magnetic attractive force model for the magnetic capture device comprises:

establishing the magnetic attractive force model for the magnetic capture device according to a magnetic attractive force applied by the magnetic capture device and a distance between a magnetic surface of the magnetic capture device and a captured surface of the target, wherein the established magnetic attractive force model for the magnetic capture device is that:

$$F = k_1 \times e^{-l_1 \times x} + k_2 \times e^{-l_2 \times x}$$

wherein, F represents the magnetic attractive force applied by the magnetic capture device in Newtons, x represents the distance between the magnetic surface of the magnetic capture device and the captured surface of the target in millimeters, and each of $k_1$, $k_2$, $l_1$, and $l_2$ represent a parameter to be fitted to a non-zero value, and the determining a magnetic attractive force characteristic of the magnetic capture device according to the magnetic attractive force model is that:

when the distance between the magnetic surface of the magnetic capture device and the captured surface of the target is smaller than a predetermined distance threshold, the magnetic attractive force applied by the magnetic capture device is larger than a predetermined force threshold, while, when the distance between the magnetic surface of the magnetic capture device and the captured surface of the target is larger than the predetermined distance threshold, the magnetic attractive force applied by the magnetic capture device is smaller than the predetermined force threshold, and determining a capture strategy for the target based on the magnetic attractive force characteristic of the magnetic capture device, and capturing the target according to the capture strategy and determining whether the target is captured based on a preset determination condition.

14. The non-transitory storage medium according to claim 13, wherein the determining a capture strategy for the target based on the magnetic attractive force characteristic of the magnetic capture device comprises:

determining a self-spin angular velocity of the target based on a spacing distance between the magnetic surface of the magnetic capture device and a centroid of the target, obtaining a constraint condition for the spacing distance between the magnetic surface of the magnetic capture device and the centroid of the target based on the self-spin angular velocity of the target, and determining the capture strategy for the target based on the magnetic attractive force characteristic of the magnetic capture device and the constraint condition.

15. The non-transitory storage medium according to claim 14, wherein, the determining a self-spin angular velocity of the target based on a spacing distance between the magnetic surface of the magnetic capture device and a centroid of the target comprises:

in the case that the target is assumed to be a square with side length d, determining that in the process where the magnetic capture device approaches and captures the target, the spacing distance L between the magnetic surface of the magnetic capture device and the centroid of the target is that: L gradually varies from $$L = \frac{\sqrt{2}}{2} \times d \text{ to } L = \frac{1}{2} \times d,$$

and
determining that in the process where L gradually varies from $$L = \frac{\sqrt{2}}{2} \times d \text{ to } L = \frac{1}{2} \times d,$$

the self-spin angular velocity $\Omega$ of the target is that:

$$\Omega \leq \frac{\pi}{4T_1},$$

wherein, $T_1$ is a total time consumed from the start to the completion of the capture.

16. The non-transitory storage medium according to claim 15, wherein the obtaining a constraint condition for the spacing distance between the magnetic surface of the magnetic capture device and the centroid of the target based on the self-spin angular velocity of the target comprises:
based on the self-spin angular velocity of the target, when the maximum of the self-spin angular velocity $\Omega$ is $$\frac{\pi}{4T_1},$$

in order to prevent a collision between the magnetic capture device and the target, determining that the constraint condition for the spacing distance L between the magnetic surface of the magnetic capture device and the centroid of the target is that:

$$L > \frac{d}{2 \times \sin\left(\frac{3\pi}{4} - \Omega \times t\right)} + r \times \tan\left(\frac{\pi}{4} - \Omega \times t\right)$$

wherein, t represents the time consumed in the capture process which starts from a capture zero timing at which $$\Omega = \frac{\pi}{4T_1}$$

is reached, and r represents the radius of the magnetic surface of the magnetic capture device.

17. The non-transitory storage medium according to claim 14, wherein the determining the capture strategy for the target based on the magnetic attractive force characteristic of the magnetic capture device and the constraint condition comprises:
based on the magnetic attractive force characteristic of the magnetic capture device and the constraint condition, determining a multistage capture strategy for the target, wherein
in an initial stage of the approach of the magnetic capture device to the target, the magnetic capture device approaches the target at a first speed that is larger than a predetermined speed threshold and operates at a first power, and
in a final stage of the approach of the magnetic capture device to the target, the magnetic capture device approaches the target at a second speed which is smaller than the first speed and operates at a second power which is smaller than the first power.

* * * * *